(12) United States Patent
Visser et al.

(10) Patent No.: US 7,714,305 B2
(45) Date of Patent: *May 11, 2010

(54) LITHOGRAPHIC APPARATUS AND DEVICE MANUFACTURING METHOD

(75) Inventors: Huibert Visser, Zevenhuizen (NL); David William Callan, Norwalk, CT (US); Robert-Han Munnig Schmidt, Hapert (NL); George Howard Robbins, New Canaan, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 636 days.

This patent is subject to a terminal disclaimer.

(21) Appl. No.: 11/371,232

(22) Filed: Mar. 9, 2006

(65) Prior Publication Data

US 2007/0150779 A1    Jun. 28, 2007

Related U.S. Application Data

(63) Continuation-in-part of application No. 11/297,641, filed on Dec. 9, 2005, now Pat. No. 7,626,181.

(51) Int. Cl.
*G21G 1/00* (2006.01)

(52) U.S. Cl. .................. 250/492.2; 250/492.1; 355/53; 355/60; 378/34; 378/35

(58) Field of Classification Search .............. 250/492.1, 250/492.2; 355/53, 60; 378/34, 35
See application file for complete search history.

(56) References Cited

U.S. PATENT DOCUMENTS

| | | | |
|---|---|---|---|
| 3,742,234 A | 6/1973 | Laakmann | |
| 3,811,748 A | 5/1974 | Treuthart | |
| 3,936,193 A | 2/1976 | Auth | |
| 4,025,203 A | 5/1977 | Lee | |
| 4,155,630 A | 5/1979 | Ih | |
| 4,327,975 A | 5/1982 | Harris | |
| 4,491,383 A | 1/1985 | Pera et al. | |
| 4,577,932 A | 3/1986 | Gelbart | |
| 4,668,080 A | 5/1987 | Gale et al. | |
| 4,708,420 A | 11/1987 | Liddiard | |
| 4,726,671 A | 2/1988 | Ahmad et al. | |
| 4,732,440 A | 3/1988 | Gadhok | |
| 4,851,978 A | 7/1989 | Ichihara | |

(Continued)

FOREIGN PATENT DOCUMENTS

EP    823662 A2 *  2/1998

(Continued)

OTHER PUBLICATIONS

European Search Report dated Oct. 1, 2003.

(Continued)

*Primary Examiner*—Jack I Berman
*Assistant Examiner*—Hanway Chang
(74) *Attorney, Agent, or Firm*—Sterne, Kessler, Goldstein & Fox P.L.L.C

(57) ABSTRACT

Apparatus and methods for compensating for the movement of a substrate in a lithographic apparatus during a pulse of radiation include providing a pivotable mirror configured to move a patterned radiation beam incident on the substrate in substantial synchronism with the substrate.

37 Claims, 5 Drawing Sheets

U.S. PATENT DOCUMENTS

| | | | |
|---|---|---|---|
| 4,861,125 A | | 8/1989 | Vaught |
| 4,970,546 A | | 11/1990 | Suzuki et al. |
| 5,121,138 A | | 6/1992 | Schermer et al. |
| 5,229,872 A | | 7/1993 | Mumola |
| 5,296,891 A | | 3/1994 | Vogt et al. |
| 5,430,571 A | | 7/1995 | Witteveen |
| 5,500,736 A | | 3/1996 | Koitabashi et al. |
| 5,523,193 A | | 6/1996 | Nelson |
| 5,530,482 A | | 6/1996 | Gove et al. |
| 5,579,147 A | | 11/1996 | Mori et al. |
| 5,677,703 A | | 10/1997 | Bhuva et al. |
| 5,684,566 A | | 11/1997 | Stanton |
| 5,808,797 A | | 9/1998 | Bloom et al. |
| 5,949,544 A | | 9/1999 | Manning |
| 5,969,441 A | * | 10/1999 | Loopstra et al. ............... 310/12 |
| 5,982,553 A | | 11/1999 | Bloom et al. |
| 6,046,792 A | | 4/2000 | Van Der Werf et al. |
| 6,133,986 A | | 10/2000 | Johnson |
| 6,177,980 B1 | | 1/2001 | Johnson |
| 6,204,875 B1 | | 3/2001 | De Loor et al. |
| 6,249,381 B1 | | 6/2001 | Suganuma |
| 6,268,904 B1 | * | 7/2001 | Mori et al. ..................... 355/53 |
| 6,317,169 B1 | | 11/2001 | Smith |
| 6,379,867 B1 | | 4/2002 | Mei et al. |
| 6,556,279 B1 | | 4/2003 | Meisburger et al. |
| 6,633,366 B2 | | 10/2003 | de Jager et al. |
| 6,687,041 B1 | | 2/2004 | Sandstrom |
| 6,707,534 B2 | | 3/2004 | Bjorklund et al. |
| 6,731,376 B1 | | 5/2004 | Markle |
| 6,747,783 B1 | | 6/2004 | Sandstrom |
| 6,753,947 B2 | | 6/2004 | Meisburger et al. |
| 6,765,712 B2 | | 7/2004 | Van Dijsseldonk et al. |
| 6,795,169 B2 | | 9/2004 | Tanaka et al. |
| 6,798,494 B2 | | 9/2004 | Naulleau |
| 6,803,938 B2 | | 10/2004 | Turner |
| 6,806,897 B2 | | 10/2004 | Kataoka et al. |
| 6,811,953 B2 | | 11/2004 | Hatada et al. |
| 6,831,765 B2 | | 12/2004 | Yasuda et al. |
| 7,015,491 B2 | * | 3/2006 | Eurlings et al. ............. 250/548 |
| 7,098,871 B1 | * | 8/2006 | Tegreene et al. ............... 345/7 |
| 7,283,210 B2 | | 10/2007 | Hazelton |
| 7,367,931 B2 | | 5/2008 | Barclay et al. |
| 7,626,181 B2 | | 12/2009 | Visser et al. |
| 2001/0010536 A1 | | 8/2001 | Katzir et al. |
| 2001/0048515 A1 | | 12/2001 | Mei |
| 2003/0006360 A1 | * | 1/2003 | Hatam-Tabrizi et al. .. 250/206.1 |
| 2003/0123040 A1 | | 6/2003 | Almogy |
| 2004/0001265 A1 | | 1/2004 | Pesik |
| 2004/0041104 A1 | | 3/2004 | Liebregts et al. |
| 2004/0076203 A1 | | 4/2004 | Kaminsky et al. |
| 2004/0130561 A1 | | 7/2004 | Jain |
| 2004/0141166 A1 | * | 7/2004 | Bleeker et al. ................. 355/53 |
| 2005/0007572 A1 | | 1/2005 | George et al. |
| 2005/0116038 A1 | | 6/2005 | Lewis et al. |
| 2006/0018025 A1 | | 1/2006 | Sharon et al. |
| 2006/0061749 A1 | | 3/2006 | Bleeker et al. |
| 2006/0087635 A1 | | 4/2006 | Kazumi et al. |
| 2006/0110665 A1 | | 5/2006 | Bleeker et al. |
| 2007/0150778 A1 | * | 6/2007 | Visser ........................ 714/720 |
| 2007/0162781 A1 | * | 7/2007 | Visser et al. .................... 714/3 |
| 2008/0013097 A1 | | 1/2008 | E. del Puerto |

FOREIGN PATENT DOCUMENTS

| | | |
|---|---|---|
| EP | 1 115 031 | 7/2001 |
| EP | 1 469 348 A1 | 10/2004 |
| EP | 1 659 451 A2 | 5/2006 |
| EP | 1 795 966 A1 | 6/2007 |
| WO | WO 98/33096 | 7/1998 |
| WO | WO 98/38597 | 9/1998 |
| WO | WO 98/40791 | 9/1998 |
| WO | WO 03/071353 A2 | 8/2003 |

OTHER PUBLICATIONS

European Search Report issued for European Patent Application No. 06256076.8-1226, dated May 7, 2007.

Response to Written Opinion dated Nov. 4, 2008 for European Application No. 07252547, 3 pgs.

Non-Final Rejection mailed Dec. 16, 2008 for U.S. Appl. No. 11/473,326, filed Jun. 23, 2006, 27 pgs.

Non-Final Rejection mailed Oct. 10, 2008 for U.S. Appl. No. 11/297,641, filed Dec. 9, 2005, 16 pgs.

Extended European Search Report issued for European Patent Application No. 07252547.0-1226/ 1870773, dated June 23, 2009.

Final Rejection mailed Mar. 23, 2009 for U.S. Appl. No. 11/297,641, filed Dec. 9, 2005, 13 pgs.

Final Rejection mailed May 12, 2009 for U.S. Appl. No. 11/473,326, filed Jun. 23, 2006, 31 pgs.

Notice of Allowance mailed Nov. 23, 2009 for U.S. Appl. No. 11/473,326, filed Jun. 23 2006, 9 pgs.

* cited by examiner

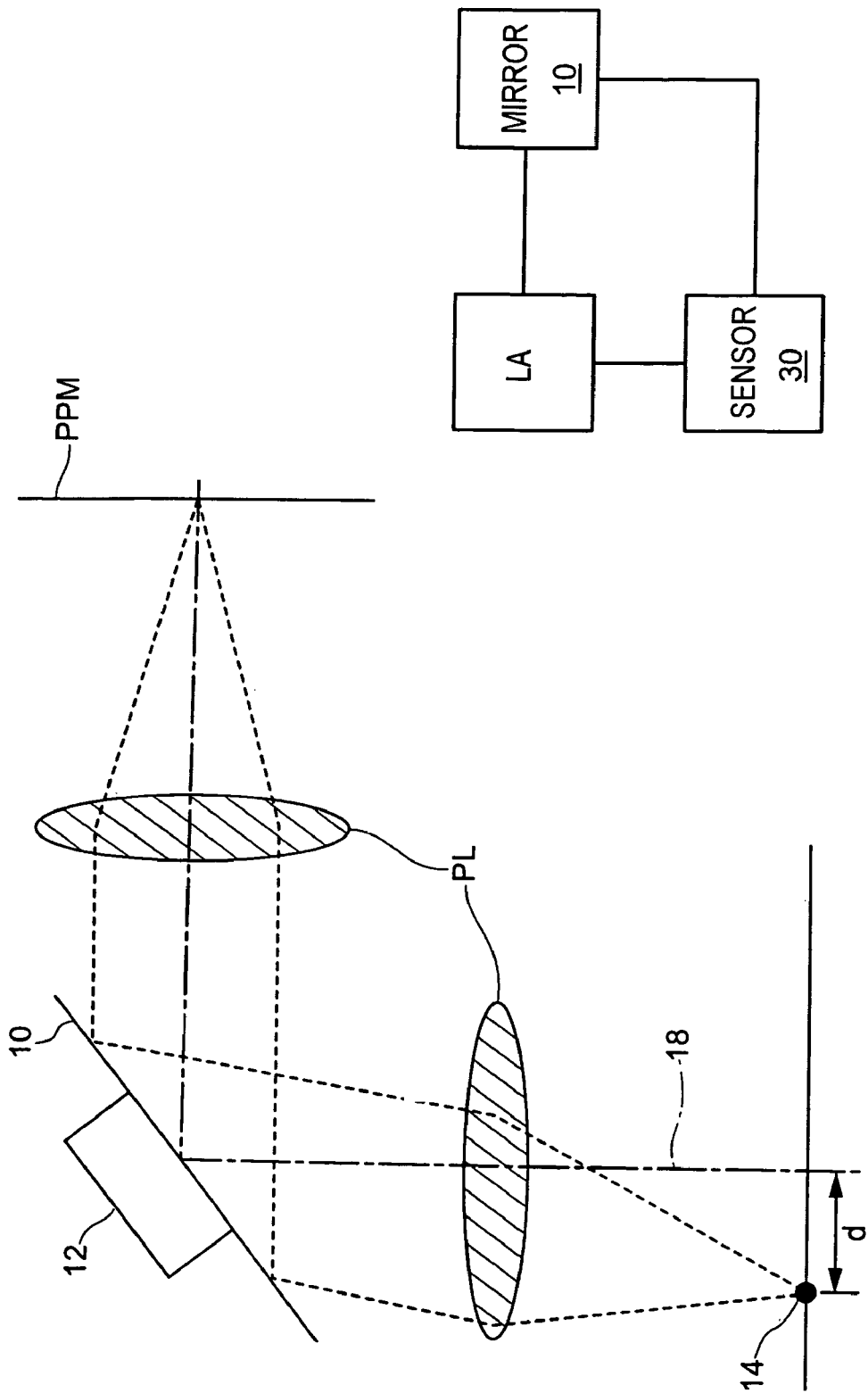

LITHOGRAPHIC APPARATUS AND DEVICE MANUFACTURING METHOD

RELATED APPLICATIONS

This application is a continuation-in-part of U.S. patent application Ser. No. 11/297,641 filed Dec. 9, 2005, the entire contents of which is hereby incorporated by reference.

FIELD OF THE INVENTION

The present invention relates to lithographic projection apparatus and methods.

BACKGROUND

The term "programmable patterning structure" as here employed should be broadly interpreted as referring to any configurable or programmable structure or field that may be used to endow an incoming radiation beam with a patterned cross-section, corresponding to a pattern that is to be created in a target portion of a substrate; the terms "light valve" and "spatial light modulator" (SLM) can also be used in this context. Generally, such a pattern will correspond to a particular functional layer in a device being created in the target portion, such as an integrated circuit or other device (see below). Examples of such patterning structure include:

A programmable mirror array. One example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the undiffracted radiation can be filtered out of the reflected beam, leaving only the diffracted radiation behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g., by application of an electric potential) to form a grating that reflects incident radiation as diffracted radiation. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193 and PCT Patent Application Nos. WO 98/38597 and WO 98/33096, which documents are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

It should be appreciated that where pre-biasing of features, optical proximity correction features, phase variation techniques, and/or multiple exposure techniques are used, the pattern "displayed" on the programmable patterning structure may differ substantially from the pattern eventually transferred to the substrate or layer thereof.

Lithographic projection apparatus can be used, for example, in the manufacture of integrated circuits (ICs), flat panel displays, and other devices involving fine structures. In such a case, the programmable patterning structure may generate a circuit pattern corresponding to an individual layer of, for example, the IC, and this pattern can be imaged onto a target portion (e.g., comprising one or more dies and/or portion(s) thereof) on a substrate (e.g., a glass plate or a wafer of silicon or other semiconductor material) that has been coated with a layer of radiation-sensitive material (e.g., resist). In general, a single substrate will contain a whole matrix or network of adjacent target portions that are successively irradiated via the projection system (e.g., one at a time).

The lithographic projection apparatus may be of a type commonly referred to as a step-and-scan apparatus. In such an apparatus, each target portion may be irradiated by progressively scanning the mask pattern under the beam in a given reference direction (the "scanning" direction) while substantially synchronously scanning the substrate table parallel or anti-parallel to this direction. Since, in general, the projection system will have a magnification factor M (generally<1), the speed V at which the substrate table is scanned will be a factor M times that at which the mask table is scanned. A beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g., in a mask) is imaged onto a substrate that is at least partially covered by a layer of radiation-sensitive material (e.g., resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g., an IC). For example, these transfer procedures may result in a patterned layer of resist on the substrate. One or more pattern processes may follow, such as deposition, etching, ion-implantation (doping), metallization, oxidation, chemo-mechanical polishing, etc., each of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

The term "projection system" should be broadly interpreted as encompassing various types of projection system, including refractive optics, reflective optics, catadioptric systems, and micro lens arrays, for example. It is to be understood that the term "projection system" as used in this application simply refers to any system for transferring the patterned beam from the programmable patterning structure to the substrate. For the sake of simplicity, the projection system may hereinafter be referred to as the "projection lens." The radiation system may also include components operating according to any of these design types for directing, shaping, reducing, enlarging, patterning, and/or otherwise controlling the beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g., water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is known in the art.

In the present document, the terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range 5-20 nm), as well as particle beams (such as ion beams or electron beams).

In presently known lithographic projection apparatus using programmable patterning structure, the substrate table is scanned in the path of the patterned radiation beam (e.g., below the programmable patterning structure). A pattern is set on the programmable patterning structure and is then exposed on the substrate during a pulse of the radiation system. In the interval before the next pulse of the radiation system, the substrate table moves the substrate to a position as required to expose the next target portion of the substrate (which may include all or part of the previous target portion), and the pattern on the programmable patterning structure is updated if necessary. This process may be repeated until a complete line (e.g., row of target portions) on the substrate has been scanned, whereupon a new line is started.

During the small but finite time that the pulse of the radiation system lasts, the substrate table may consequently have moved a small but finite distance. Previously, such movement has not been a problem for lithographic projection apparatus using programmable patterning structure, e.g., because the size of the substrate movement during the pulse has been small relative to the size of the feature being exposed on the substrate. Therefore the error produced was not significant. However, as the features being produced on substrates become smaller, such error becomes more significant. U.S. Publication Application No. 2004/0141166 proposes one solution to this problem.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display (LCD) panels, thin-film magnetic heads, thin-film-transistor (TFT) LCD panels, printed circuit boards (PCBs), DNA analysis devices, etc. The skilled artisan will appreciate that, in the context of such alternative applications, any use of the terms "wafer" or "die" in this text should be considered as being replaced by the more general terms "substrate" and "target portion", respectively.

SUMMARY

According to an embodiment of the invention, there is provided a lithographic projection apparatus, comprising a projection system configured to project a patterned radiation beam onto a target portion of a substrate; a positioning structure configured to move the substrate relative to the projection system during exposure by the patterned radiation beam; a pivotable mirror configured to move the patterned radiation beam relative to the projection system during at least one pulse of the patterned radiation beam; and an actuator configured to oscillatingly pivot the mirror according to an oscillation timing that substantially corresponds to a pulse frequency of a radiation system and such that the patterned radiation beam is scanned in substantial synchronism with the movement of the substrate during the at least one pulse.

According to an embodiment of the invention, there is provided a device manufacturing method, comprising: providing a pulsed beam of radiation; patterning the pulsed beam of radiation according to a desired pattern; projecting the patterned radiation beam onto a target portion of a layer of radiation-sensitive material that at least partially covers a substrate; moving the substrate relative to a projection system that projects the patterned radiation beam onto the substrate during exposure; and oscillatingly pivoting a pivotable mirror according to an oscillation timing that substantially corresponds to a pulse frequency of the patterned radiation beam, so as to alter a path of the patterned radiation beam relative to the projection system during at least one pulse of the patterned radiation beam, wherein the path is altered in substantial synchronism with the movement of the substrate during the at least one pulse and wherein a cross-section of the patterned radiation beam is projected onto a plane substantially parallel to a surface of the target portion of the substrate.

According to an embodiment of the invention, there is provided a device manufacturing method, comprising: moving a substrate relative to a projection system that projects a patterned radiation beam onto a substrate during exposure; oscillatingly pivoting a pivotable mirror according to an oscillation timing that substantially corresponds to a pulse frequency of the patterned radiation beam so as to alter a path of the patterned radiation beam in substantial synchronism with movement of the substrate; and projecting the patterned radiation beam onto the substrate.

BRIEF DESCRIPTION OF THE DRAWINGS

Exemplary embodiments of the invention will now be described, by way of example only, with reference to the accompanying schematic drawings in which:

FIG. 4 schematically depicts a structure configured to move the patterned radiation beam after further movement of the structure;

FIG. 5 schematically depicts an example of a control loop that may be used to control the movement of the structure.

In the Figures, corresponding reference symbols indicate corresponding parts.

DETAILED DESCRIPTION

Embodiments of the invention include, for example, methods and apparatus that may be used to reduce errors caused by movement of the substrate during a pulse of the radiation system.

Figure 1:
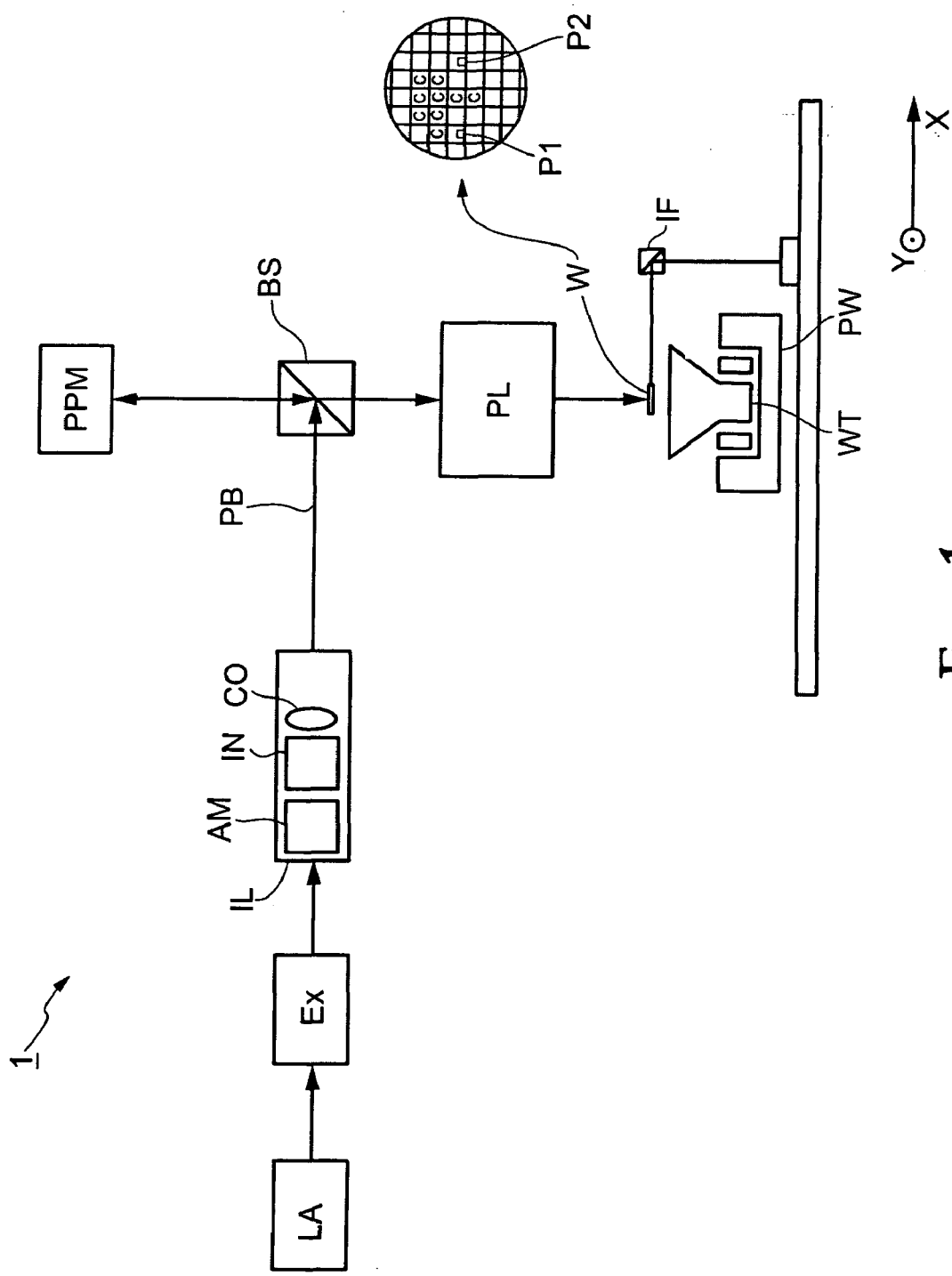
FIG. 1 depicts a lithographic projection apparatus according to an embodiment of the invention.

FIG. 1 schematically depicts a lithographic projection apparatus 1 according to a particular embodiment of the invention. The apparatus comprises:

A radiation system configured to supply (e.g., having structure capable of supplying) a beam of radiation. In this particular example, the radiation system Ex, IL, for supplying a beam PB of radiation (e.g., UV or EUV radiation) also comprises a radiation source LA;

A programmable patterning structure PPM (e.g., a programmable mirror array) configured to apply a pattern to the beam. In general, the position of the programmable patterning structure will be fixed relative to projection system PL. However, it may instead be connected to a positioning structure configured to accurately position it with respect to projection system PL;

An object table (substrate table) WT configured to hold a substrate. In this example, substrate table WT is provided with a substrate holder for holding a substrate W (e.g., a resist-coated semiconductor wafer) and is connected to a positioning structure PW for accurately positioning the substrate with respect to projection system PL and (e.g., interferometric) measurement structure IF, which is configured to accurately indicate the position of the substrate and/or substrate table with respect to projection system PL; and A projection system ("projection lens") PL (e.g., a quartz and/or $CaF_2$ projection lens system, a catadioptric system comprising lens elements made from such materials, and/or a mirror system) configured to project the patterned beam onto a target portion C (e.g., comprising one or more dies and/or portion(s) thereof) of the substrate W. The projection system may project an image of the programmable patterning structure onto the substrate.

As here depicted, the apparatus is of a reflective type (e.g., has a reflective programmable patterning structure). However, in general, it may also be of a transmissive type (e.g., with a transmissive programmable patterning structure) or have aspects of both types.

The source LA (e.g., a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the beam at, for example, the substrate. In addition, the apparatus will generally comprise various other components, such as an integrator IN and a condenser CO. In this way, the beam PB impinging on the programmable patterning structure PPM has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable direction mirrors); this latter scenario is often the case when the source LA is an excimer laser. The one or more embodiments of the invention and the claims encompass both of these scenarios. In a typical source LA, there are a number of effects that can result in imaging errors in lithographic imaging processes. In an embodiment wherein the source LA provides pulsed radiation, for instance, these may include pulse amplitude variation, pulse-width variation, and pulse-to-pulse variation, also known as jitter.

The beam PB subsequently intercepts the programmable patterning structure PPM, which may be held on a mask table (not shown). Having been selectively reflected by (alternatively, having traversed) the programmable patterning structure PPM, the beam PB passes through the projection system PL, which focuses the beam PB onto a target portion C of the substrate W. In the embodiment of FIG. 1, a beam splitter BS serves to direct the beam to the patterning structure PPM, while also allowing it to pass through to the projection system PL, however alternate geometries are within the scope of one or more embodiments of the present invention. It should be appreciated that although an embodiment of the present invention is described herein in relation to a lithographic apparatus incorporating a programmable patterning structure to impart a pattern to a beam of radiation, the invention is not limited to such an arrangement. In particular, an embodiment of the invention may be used in conjunction with a lithographic apparatus in which a mask, for example held on a mask table, is used to impart a pattern to the beam of radiation.

With the aid of the positioning structure (and interferometric measuring structure IF), the substrate table WT can be moved accurately, e.g., so as to position different target portions C in the path of the beam PB. Where used, a positioning structure for the programmable patterning structure PPM can be used to accurately position the programmable patterning structure PPM with respect to the path of the beam PB (e.g., after a placement of the programmable patterning structure PPM, between scans, and/or during a scan).

In general, movement of the object table WT may be realized with the aid of a long-stroke module (e.g., for coarse positioning) and a short-stroke module (e.g., for fine positioning), which are not explicitly depicted in FIG. 1. A similar system may be used to position the programmable patterning structure PPM. It will be appreciated that, to provide the required relative movement, the beam may alternatively or additionally be movable, while the object table and/or the programmable patterning structure PPM may have a fixed position. Programmable patterning structure PPM and substrate W may be aligned using substrate alignment marks P1, P2 (possibly in conjunction with alignment marks of the programmable patterning structure PPM).

The depicted apparatus can be used in several different modes. In one scan mode, the mask table is movable in a given direction (the so-called "scan direction," e.g., the y direction) with a speed v, so that the beam PB is caused to scan over a mask image. Concurrently, the substrate table WT is simultaneously moved in the same or opposite direction at a speed V=Mv, in which M is the magnification of the projection system PL (typically, M=¼ or ⅕). In some embodiments, the demagnification is significantly smaller than 1, for example smaller than 0.3, smaller than 0.1, smaller than 0.05, smaller than 0.01, smaller than 0.005, or smaller than 0.0035. Likewise, it is contemplated that M may be larger than 0.001, or may be within a range between 0.001 and the foregoing upper limits. In this manner, a relatively large target portion C can be exposed, without having to compromise on resolution.

In another mode, the mask table is kept essentially stationary holding a programmable patterning structure, and the substrate table WT is moved or scanned while a pattern imparted to the beam is projected onto a target portion C. In this mode, generally a pulsed radiation source is employed and the programmable patterning structure is updated as required after each movement of the substrate table WT or in between successive radiation pulses during a scan. This mode of operation can be readily applied to lithography that utilizes programmable patterning structure, such as a programmable mirror array as referred to above.

Combinations and/or variations on the above-described modes of use or entirely different modes of use may also be employed.

An apparatus as depicted in FIG. 1 may be used, for example, in the following manner. In pulse mode, the programmable patterning structure PPM is kept essentially stationary, and the entire pattern is projected onto a target portion C of the substrate using a pulsed radiation source. The substrate table WT is moved with an essentially constant speed such that the beam PB is caused to scan a line across the substrate W. The pattern on the programmable patterning structure PPM is updated as required between pulses of the radiation system, and the pulses are timed such that successive target portions C are exposed at the required locations on the substrate W. Consequently, the beam PB can scan across the substrate W to expose the complete pattern for a strip of the substrate. Such a process may be repeated until the complete substrate W has been exposed line by line. Different modes may also be used.

Because of the relative motion of the substrate table during imaging, changes in the time domain at the radiation source LA map to changes in the spatial domain at the substrate table WT. This results in two main effects. First, when there is a change in the pulse interval, there is a change in imaged position on the substrate. For example, a pulse interval that is slightly longer than average results in a greater distance between imaged portions of the substrate. Second, a change in pulse duration results in a blurring effect, as a longer or shorter portion of the substrate traverses the image field during the pulse.

Figure 2:
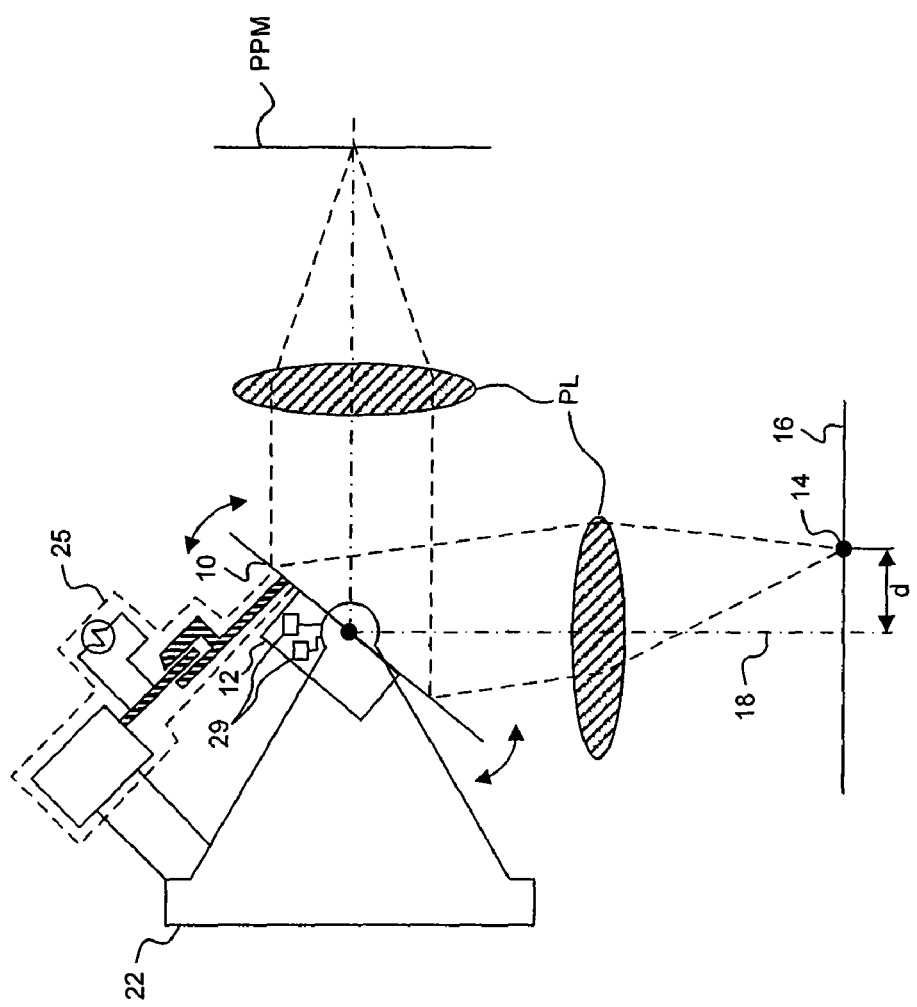
FIG. 2 schematically depicts a structure configured to move the patterned radiation beam according to an embodiment of the present invention.

In order to account for the movement of the substrate table WT, a device in accordance with an embodiment of the present invention may include a mirror 10 forming a part of the projection system PL, as shown in FIG. 2. In particular, the mirror 10 is beneficially located proximate a pupil of the projection system PL or at a conjugate plane thereof. Though FIG. 2 shows the projection system PL as a two-part device, with the mirror 10 bisecting the projection system PL, that is not, in general, a requirement of one or more embodiments of the present invention. To the contrary, the specific arrangement of the projection system PL may be varied as required according to other desired imaging characteristics. As will be appreciated, the mirror 10 should be substantially planar, though in practice it may be possible to allow for some curvature, whereby a portion of the optical power of the projection system resides in the mirror.

An actuator, or group of actuators, 12 is positioned to move the mirror 10 during an imaging operation. In a particular embodiment, the actuator 12 is arranged to rotate the mirror 10 about a small angle at a relatively high frequency, and with a small displacement. The pivotable mirror 10 is supported by a support assembly 22. A frequency of oscillation timing of the mirror 10 substantially corresponds to a resonance frequency of the mirror 10 and support assembly 22. Support assembly 22 includes counter-mass 25, constructed and arranged to isolate forces produced by the actuator 12 from a remaining part of the apparatus. Actuator 12 includes multiple motors 29, and is constructed and arranged to impart rotational forces on the mirror 10.

The system of FIG. 2 is shown as having a 1:1 magnification ratio, and a relatively large rotation of the mirror 10. As a result, the focal point 14 at the image plane 16 is displaced from the optical axis 18 by a relatively large amount d. In practice, there may be a significant de-magnification, and the tilt of the mirror 10 will be quite small, so that the displacement may then be quite small. In particular, the displacement of the image should correspond substantially to a distance traversed by the substrate table over the duration of a single pulse of the radiation source.

By way of example, a displacement at the mirror 10 of 1 nm at the position of a marginal ray maps to a displacement at the image plane 16 of 1/NA, where NA is the numerical aperture of the projection system PL. Likewise, the rotational change of the mirror a' [in rad/s] that translates over the diameter of the beam at the pupil D [in m] equals to a velocity v at substrate level [in m/s] as follows: v=a' D/(2 NA).

Figure 3:
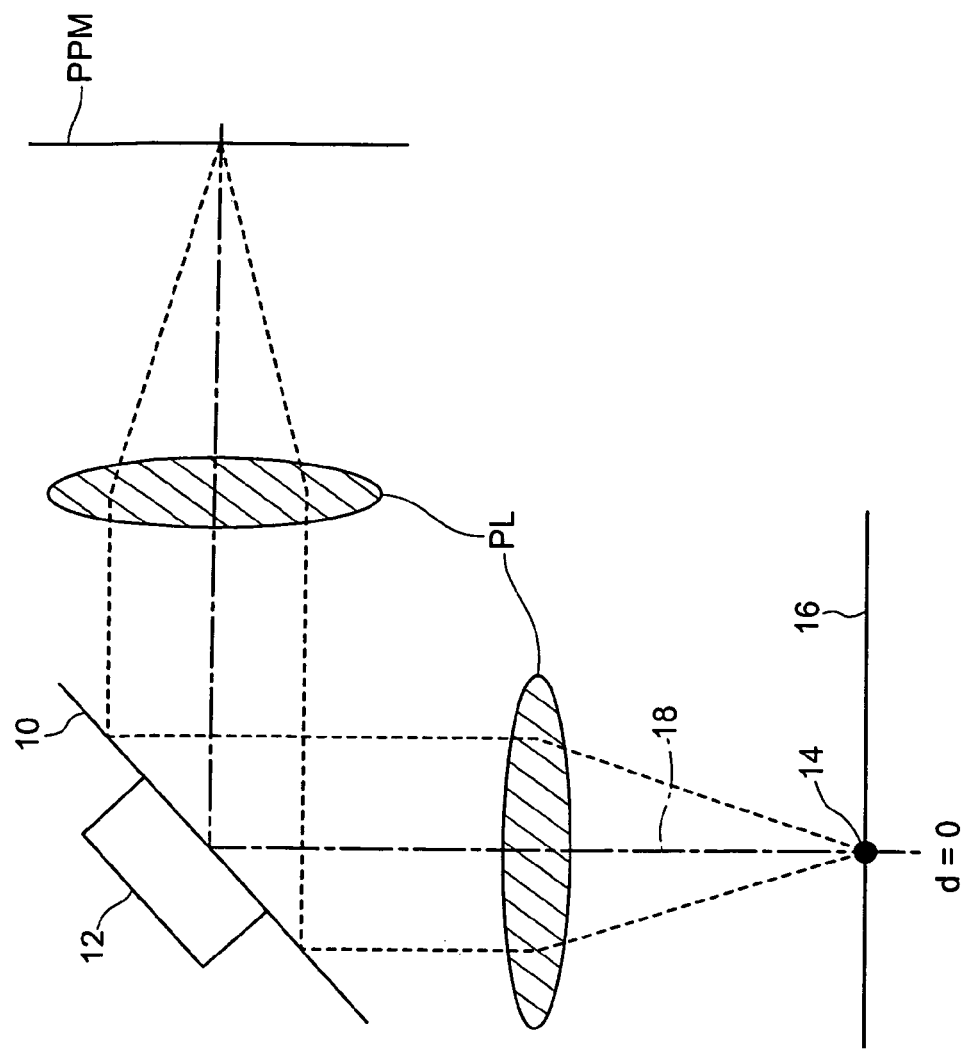
FIG. 3 schematically depicts a structure configured to move the patterned radiation beam after a partial movement of the structure.

FIGS. 3 and 4 illustrate schematically later times in a single scan, as successive pulses are imaged onto the focal plane. In FIG. 3, the mirror 10 has rotated through to its zero-crossing, and the focal point 14 is aligned with the optical axis 18. FIG. 4 continues the motion and the focal point 14 is once more displaced from the optical axis 18, in a direction opposite to its initial displacement of FIG. 2.

In a typical lithographic apparatus, the source LA may have a pulse repetition rate on the order of 1-10 kHz. As a result, it is useful to ensure that the mirror 10 can be adequately vibrated in phase with that frequency, meaning that the actuator or actuators 12 should be adapted for high frequency operation. Furthermore, if the mirror 10 is designed so that, along with its associated mounting structure, it has a resonant frequency that is substantially equal to the pulse frequency of the source LA, energy required to move the mirror should be minimized. This has the additional effect that the load on the actuators and consequently the deformation load on the mirror 10 should be minimized.

In furtherance of the goal of matching the frequency of the vibration of the mirror 10 with the pulse frequency of the source LA, it is possible to include a sensor 30 that is connected in a control loop with the mirror 10, its actuator(s) 12 and, if required, the substrate table. For synchronization of the movement of the mirror to the source pulse frequency, different methods may be used. By way of example, a signal from the sensor 30 on the vibrating mirror may be used to trigger the source pulse, or a phase locked loop system may be used where the source frequency is fixed to the average resonant frequency of the mirror while the controller adjusts the mirror frequency and phase to the fixed source frequency. As a further example, an external timing source may be provided that both triggers the source pulse and is used to control both the phase and amplitude of the mirror motion.

In addition to ensuring that the frequency of vibration of the mirror 10 is substantially synchronized with the frequency of the source LA, it may be beneficial to ensure that the amplitude A of the rotational velocity of the mirror 10 corresponds to a scan speed of the substrate table.

Further by way of example, in a typical system, the actual values may be as follows. The scan speed may be on the order of 10 mm/s, NA=1, and D=20 mm. This leads to a'=1 rad/s at the zero-crossing of a sinusoidal rotational movement of the mirror 10. Given that for a sinusoidal movement a=A sin(2π t υ) where A is the amplitude in rad, so the time derivative equals: a'=A 2 π υ cos(2 π t υ). At t=0 this becomes: a'=A 2 π υ so that for a 1 kHz vibration, the amplitude of the movement of the mirror becomes: A=0.16 mrad.

The choice of a sinusoidal rotational motion of the mirror may allow for some useful effects. In particular, by choosing a portion of the motion close to the zero crossing to coincide with the imaging pulse, and a small amplitude, the sinusoidal motion is substantially linear. Furthermore, the gradual deceleration and acceleration at the end points of the motion reduce stresses on the mirror, which, if unchecked, could lead to deformations of the mirror over time. It should be appreciated, however, that one or more embodiments of the invention are not limited to the use of a sinusoidal rotation motion.

The mirror may also be coupled to one or more balance masses. The one or more balance masses are configured to take up and isolate forces produced by the actuator in vibrating the mirror. In particular, the one or more balance masses are configured to be freely movable in a direction opposite to the forces generated by the actuator, conserving momentum of the balance mass-mirror system and thereby reducing forces introduced into other portions of the lithographic apparatus.

Embodiments of the present invention can provide the ability to increase pulse time as a result of decreasing blur associated with movement of the substrate table. One useful result of increased pulse time is the ability to reduce peak intensity, without reducing a total energy per pulse, thereby reducing potential damage to optical components. Another useful result is that the number of temporal modes may increase, thereby reducing speckle in the optical system. Finally, longer pulse times may allow for the ability to truncate individual pulses, thereby allowing for pulse-to-pulse dose control adjustments.

Errors caused by the movement of the substrate relative to the projection system during a pulse of radiation may be reduced by providing one or more apparatus to shift the patterned radiation beam in substantial synchronism with the movement of the substrate during a pulse of radiation, which may allow the radiation beam to remain more accurately aligned on the substrate. Alternative structures that may be applied to shift the patterned radiation beam are also within the scope of one or more embodiments of the invention.

In particular, it is possible to compensate for an error of movement of the substrate relative to the projection system during a pulse of radiation. Such an error is a deviation, for example, from an intended motion of the substrate relative to the projection system, for example the substrate scanning relative to the projection system at a substantially constant speed. This deviation from the intended movement may be caused by an imperfection in the system used to control the movement of the substrate, for example cogging or a motor force factor variation within an actuator used to control the position of the substrate and/or a vibration that may be transferred to the substrate from other components within the lithographic apparatus.

The deviation of the movement of the substrate relative to the projection system from the intended movement of the substrate may be derived from the output of a sensor configured to measure the position or displacement of the substrate or a support on which the substrate is held.

The difference between the intended position of the substrate and the actual position of the substrate corresponds to a required change of position of the mirror 10. Accordingly, the actuator(s) 12 may be configured to control the movement of the mirror 10 by a combination of the movement required to oscillate the mirror in substantial synchronism with the pulse rate of the source LA such that the patterned radiation beam scans in substantial synchronism with the intended position of the substrate plus a correction in order to compensate for the deviation of the movement of the substrate relative to its intended movement.

The correction of the movement of the mirror 12 to compensate for a deviation from the intended movement of the substrate may be effected by adjusting the mid-point of the oscillation of the mirror 10. Alternatively or additionally, the adjustment may be effected by controlling a phase difference between the oscillation of the mirror 10 and the pulsing of the radiation source LA.

Figure 6:
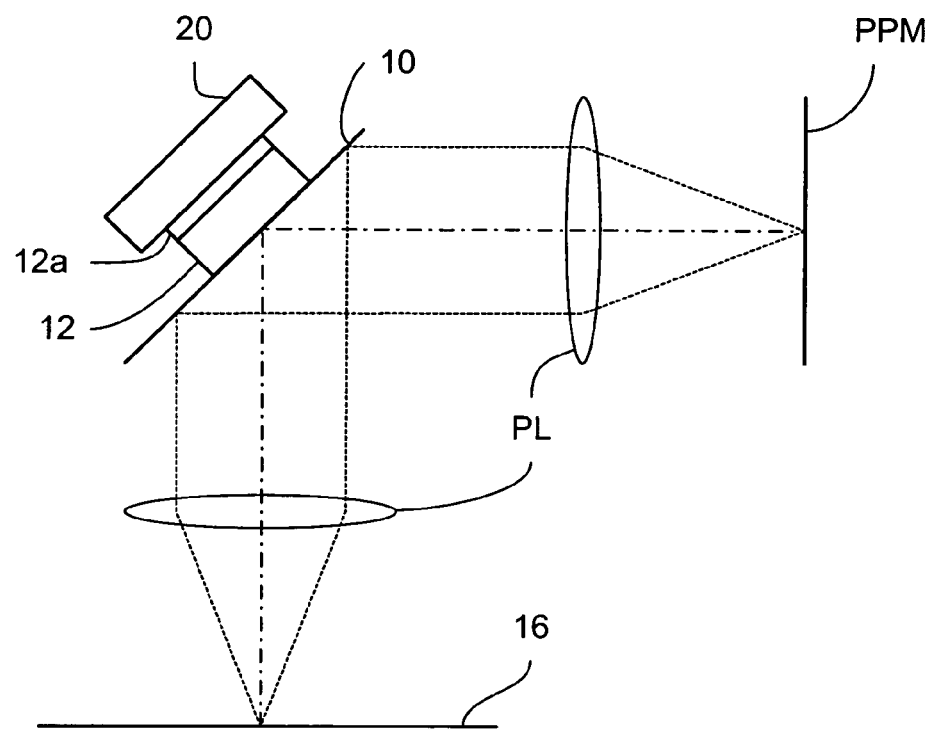
FIG. 6 schematically depicts a variant of a structure configured to move the patterned radiation beam.

Alternatively or additionally, as depicted in FIG. 6, one or more second actuators 20 may be provided that provides the adjustment of the position of the mirror 10, corresponding to the correction required to compensate for the deviation of the movement of the substrate from its intended movement, by adjusting the position of the actuator(s) 12. For example, the actuator(s) 12 may control the position of the mirror 10 relative to a base 12a of the actuator(s) 12. The second actuator(s) 20 may therefore be configured to control the position of the base 12a of the actuator(s) 12 relative to a reference within the lithographic apparatus. Accordingly, the actuator(s) 12 is used to control the oscillation of the mirror 10 such that the patterned radiation beam is scanned in substantial synchronism with the intended motion of the substrate and the second actuator(s) 20 is used in order to provide any necessary correction for deviation of the substrate from its intended movement.

Regardless of how the corrections are applied to the motion of the mirror 10, it should be appreciated that the corrections may be applied in order to rotate the mirror about the same axis as the axis about which the mirror oscillates. Alternatively or additionally, the corrections may be applied to rotate the mirror about an axis lying within a plane substantially parallel to the surface of the mirror at the location on which the patterned radiation beam is incident on the mirror, but perpendicular to the axis about which the mirror oscillates. Accordingly, the corrections may adjust for deviations from the intended movement of the substrate in a direction parallel and/or perpendicular to, respectively, the scanning motion of the substrate.

One or both of the actuator(s) 12 and the second actuators 20 may be formed from any suitable actuator or a combination thereof. In particular, one or more piezo-electric elements may be used as the actuator(s) 12,20. As an alternative, one or both of the actuator(s) may be a Lorentz actuator. An advantage of such an arrangement is that it may be arranged to minimize the transfer of vibration from one component to the other. Accordingly, the second actuator(s) 20 may, in particular, be a Lorentz actuator and configured to minimize the transfer of vibrations from the actuator(s) 12, that oscillates the mirror 10, to the remainder of the apparatus.

In general, it should be appreciated that one or both of the actuator(s) 12,20 may be able to adjust the position of the mirror in up to six degrees of freedom.

It may be desirable to move the substrate at a substantially constant velocity relative to the projection system during a series of pulses of the radiation system and the intervals in between the pulses. An apparatus as described herein may then be used to move the patterned radiation beam in substantial synchronism with the movement of the substrate for the duration of at least one pulse of the radiation system. Having the substrate moving at a substantially constant velocity may reduce the complexity of the substrate table and the positional drivers associated with it, and moving the patterned radiation beam in substantial synchronism with the movement of the substrate may reduce consequent errors.

The patterned radiation beam may be moved in substantial synchronism with the movement of the substrate during a plurality of pulses. Such an arrangement may enable the images of the programmable patterning structure to be projected onto the same part of the substrate a plurality of times. This technique may be done, for example, if the intensity of the pulse of the patterned radiation beam is not sufficient to produce a complete exposure on the substrate. Moving the patterned radiation beam in substantial synchronism with the substrate may reduce the occurrence of overlay errors between subsequent exposures of the pattern on the substrate.

Successive patterns on the programmable patterning structure that are exposed on the substrate by each pulse may be different. For example, one or more corrections may be made in one or more subsequent pulses to offset an error in a first pulse. Alternatively, a change in the pattern may be used to produce a gray scale image for one or more of the features (for example, by only exposing those features for a proportion of the total number of pulses imaged onto a given part of the substrate).

Additionally or alternatively, the intensity of the patterned radiation beam, the illumination of the programmable patterning structure, and/or the pupil filtering may be changed for one or more of the pulses of the radiation system that are projected onto the same part of the substrate. This technique may be used, for example, to increase the number of gray scales that may be generated using the technique described in the preceding paragraph or may be used to optimize different exposures for features oriented in different directions.

While specific embodiments of the invention have been described above, it will be appreciated that the invention as claimed may be practiced otherwise than as described. For example, although use of a lithography apparatus to expose a resist on a substrate is herein described, it will be appreciated that the invention is not limited to this use, and an apparatus according to an embodiment of the invention may be used to project a patterned radiation beam for use in resistless lithography. Thus, it is explicitly noted that the description of these embodiments is not intended to limit the invention as claimed.

The invention claimed is:

1. A lithographic projection apparatus, comprising:
a projection system configured to project a patterned radiation beam onto a target portion of a substrate;
a positioning structure configured to move the substrate relative to the projection system during exposure by the patterned radiation beam;
a single-faceted oscillatingly pivotable mirror configured to move the patterned radiation beam relative to the projection system during at least one pulse of the patterned radiation beam; and
an actuator configured to oscillatingly pivot the mirror according to an oscillation timing that substantially corresponds to a pulse frequency of a radiation system and such that the patterned radiation beam is scanned in substantial synchronism with the movement of the substrate during the at least one pulse.

2. The apparatus of claim 1, wherein the actuator is controlled by a controller, wherein the controller, actuator and radiation system are interconnected in a control loop arrangement, and wherein the control loop is configured to maintain substantial synchronism between oscillation of the mirror and pulses of the radiation system.

3. The apparatus of claim 1, wherein the pivotable mirror is supported by a support assembly, and a frequency of the oscillation timing substantially corresponds to a resonance frequency of the mirror and its support assembly.

4. The apparatus of claim 3, wherein the support assembly further comprises the actuator.

5. The apparatus of claim 4, wherein the support assembly further comprises a counter-mass constructed and arranged to isolate forces produced by the actuator from a remaining part of the apparatus.

6. The apparatus of claim 1, wherein the actuator comprises a plurality of motors, constructed and arranged to impart rotational forces on the mirror.

7. The apparatus of claim 1, wherein, when in use, the mirror oscillates with a sinusoidal motion.

8. The apparatus of claim 7, wherein, when in use, the pulses of the radiation system substantially correspond in timing to a zero crossing of the sinusoidal motion of the mirror oscillation.

9. The apparatus of claim 1, wherein, when in use, a position of the patterned radiation beam relative to the projection system can be further shifted in order to compensate for an error of movement of the substrate during a pulse of the patterned radiation beam.

10. The apparatus of claim 1, wherein the actuator is configured such that it can control a position of a mid-point of an oscillation of the pivotable mirror.

11. The apparatus of claim 10, wherein the pivotable mirror is configured to oscillate about a first axis and the actuator is configured to control an angular position of the mid-point of the oscillation of the pivotable mirror about the first axis.

12. The apparatus of claim 10, wherein the pivotable mirror is configured to oscillate about a first axis and the actuator is configured to control an angular position of the mid-point of the oscillation of the pivotable mirror about a second axis, the second axis being substantially perpendicular to the first axis and lying in a plane substantially parallel to a surface of the pivotable mirror at a location on which the patterned radiation beam would be incident on the pivotable mirror.

13. The apparatus of claim 1, wherein the actuator is configured to control a relative phase of a pulse frequency of the radiation system and an oscillation of the pivotable mirror.

14. The apparatus of claim 1, wherein the actuator is constructed to oscillatingly pivot the pivotable mirror relative to a base of the actuator, and further comprising a second actuator configured to control the position of the base relative to the projection system.

15. The apparatus of claim 14, wherein the actuator is configured to oscillate the pivotable mirror about a first axis and the second actuator is configured to control an angular position of the base relative to the projection system about a second axis, the second axis being substantially parallel to the first axis.

16. The apparatus of claim 14, wherein the actuator is configured to oscillate the pivotable mirror about a first axis and the second actuator is configured to control an angular position of the base relative to the projection system about a third axis, the third axis being substantially perpendicular to the first axis and lying in a plane substantially parallel to a surface of the pivotable mirror at a location on which the patterned radiation beam would be incident on the pivotable mirror.

17. The apparatus of claim 14, wherein the second actuator comprises a Lorentz actuator and is configured to minimize transfer of a vibration from the actuator to the remainder of the lithographic projection apparatus.

18. The apparatus of claim 1, wherein the mirror is substantially planar.

19. The apparatus of claim 1, wherein the mirror is located proximate a pupil plane of the projection system, or a conjugate plane thereof.

20. The apparatus of claim 1, wherein the mirror is located at a conjugate plane of a pupil plane of the projection system.

21. The apparatus of claim 1, wherein the positioning structure is configured to move the substrate at a substantially constant velocity relative to the projection system during a plurality of pulses of the patterned radiation beam and during intervals therebetween, and wherein, when in use, the patterned radiation beam is moved in substantial synchronism with movement of the substrate for a duration of at least one pulse of the patterned radiation beam.

22. The apparatus of claim 1, wherein, when in use, the patterned radiation beam is scanned in substantial synchronism with movement of the substrate during a plurality of pulses of the patterned radiation beam, such that a pattern is projected onto substantially a same place on the substrate a plurality of times.

23. The apparatus according to claim 22, wherein (i) an intensity of the patterned radiation beam, (ii) an illumination of a programmable patterning structure, (iii) a pupil filtering, or (iv) any combination of (i) to (iii), are changed for at least one of a plurality of projections of the patterned radiation beam that are directed onto substantially the same place on the substrate.

24. The apparatus of claim 1, wherein, when in use, a configuration of a pattern is changed between a plurality of projections of the patterned radiation beam that are directed onto substantially the same place on the substrate.

25. A device manufacturing method, comprising:
   moving a substrate relative to a projection system that projects a patterned radiation beam onto a substrate during exposure;
   oscillatingly pivoting a single-faceted pivotable mirror according to an oscillation timing that substantially corresponds to a pulse frequency of the patterned radiation beam so as to alter a path of the patterned radiation beam in substantial synchronism with movement of the substrate; and
   projecting the patterned radiation beam onto the substrate.

26. The method of claim 25, wherein moving the substrate includes moving the substrate at a substantially constant velocity relative to the projection system during a plurality of pulses of the patterned radiation beam and during intervals therebetween, and wherein the path is altered in substantial synchronism with the movement of the substrate for a duration of at least one pulse of the patterned radiation beam.

27. The method of claim 25, further comprising altering the path of the patterned radiation beam in substantial synchronism with the movement of the substrate during a plurality of pulses of the patterned radiation beam, such that a pattern is projected onto substantially a same place on the substrate a plurality of times.

28. The method of claim 27, further comprising changing a configuration of the pattern between a plurality of projections of the patterned radiation beam that are directed onto substantially the same place on the substrate.

29. The method of claim 27, further comprising changing (i) an intensity of the patterned radiation beam, (ii) an illumination of a programmable patterning structure, (iii) a pupil filtering, or (iv) any combination of (i) to (iii), for at least one of the plurality of projections that are directed onto substantially the same place on the substrate.

30. The method of claim 25, wherein the mirror oscillates with a sinusoidal motion.

31. The method of claim 30, wherein pulses of the patterned radiation beam substantially correspond in timing to zero crossings of the sinusoidal motion of the mirror.

32. The method of claim 25, wherein the path of the patterned radiation beam is further shifted in order to compensate for an error of movement of the substrate during a pulse of the patterned radiation beam.

33. An apparatus comprising a projection system, the projection system having:
   a single-faceted oscillatingly pivotable mirror configured to receive a patterned beam of radiation; and
   an actuator coupled to the pivotable mirror and configured to oscillatingly pivot the mirror.

34. The apparatus of claim 33, wherein the pivotable mirror is positioned in a pupil plane of the projection system, or a conjugate plane thereof.

35. The apparatus of claim 33, wherein the actuator is configured to oscillate the mirror at a frequency in the range of 1-10 kHz.

36. The apparatus of claim 33, further comprising a radiation source; and a patterning device constructed and arranged to receive a radiation beam provided by the radiation source and to pattern the radiation beam.

37. The apparatus of claim 36, wherein the patterning device is a programmable patterning device.

* * * * *